United States Patent
Miura

[11] Patent Number: 5,993,050
[45] Date of Patent: Nov. 30, 1999

[54] METHOD OF AND APPARATUS FOR EXTRACTING MODEL PARAMETERS

[75] Inventor: Noriyuki Miura, Tokyo, Japan

[73] Assignee: Oki Electric Industry Co., Ltd., Tokyo, Japan

[21] Appl. No.: 08/933,086

[22] Filed: Sep. 18, 1997

[30] Foreign Application Priority Data

Apr. 30, 1997 [JP] Japan ................................. 9-113077

[51] Int. Cl.$^6$ .................................................. G06F 17/50
[52] U.S. Cl. ............................................ 364/578; 364/488
[58] Field of Search ................................ 364/578, 488, 364/489, 490

[56] References Cited

U.S. PATENT DOCUMENTS

| | | | |
|---|---|---|---|
| 4,967,386 | 10/1990 | Maeda et al. | 364/578 |
| 5,349,539 | 9/1994 | Moriyasu | 364/578 |
| 5,379,232 | 1/1995 | Komoda | 364/489 |
| 5,467,291 | 11/1995 | Fan et al. | 364/578 |
| 5,559,715 | 9/1996 | Misheloff | 364/488 |
| 5,581,490 | 12/1996 | Ferkinhoff et al. | 364/578 |
| 5,719,796 | 2/1998 | Chen | 364/578 |
| 5,825,673 | 10/1998 | Watanabe | 364/578 |
| 5,828,580 | 10/1998 | Ho | 364/489 |

OTHER PUBLICATIONS

GodfreyJ. Gaston et al., "The Integration of Simulation and Response Surface Methodology for the Optimization of IC Processes," IEEE Transactions on Semiconductor Manufacturing, vol. 7, No. 1, Feb. 1994; pp. 22–33.

*Primary Examiner*—Vincent N. Trans
*Attorney, Agent, or Firm*—Jones Volentine, LLP

[57] ABSTRACT

A model parameter extracting apparatus comprises a range designation unit, a combination designation unit, a simulator, a calibrator, a determination unit and a range update unit. The range update unit comprises a detection unit, a new range designation unit 28 and a range shift unit. The detection unit detects a model parameter capable of providing the slightest difference between a target characteristic value and an actual value, as a quasi-optimum value. The new range designation unit designates a numerical range having a half length of that of the previous adjustment range with the quasi-optimum value set at a center, as a new adjustment range. If the quasi-optimum value is a value at one end of the adjustment range, the range shift unit shifts the adjustment range such that the quasi-optimum value is at the other end of the adjustment range while maintaining the length of the adjustment range. The apparatus realizes automation of the re-setting of a model parameter.

17 Claims, 13 Drawing Sheets

| Condition | Parameter A | Parameter B | Parameter C |
|---|---|---|---|
| 1 | l o w | l o w | l o w |
| 2 | h i g h | l o w | l o w |
| 3 | l o w | h i g h | l o w |
| 4 | l o w | l o w | h i g h |

METHOD OF AND APPARATUS FOR EXTRACTING MODEL PARAMETERS

BACKGROUND OF THE INVENTION

1. Field of the Invention

The present invention relates to a method of and apparatus for extracting model parameters for use in the process, device or circuit simulation of a semiconductor integrated circuit.

2. Description of the Related Art

Process simulation means making a model of a physical or chemical change in the material of, for example, a substrate in the semiconductor device manufacturing steps, such as ion implantation, oxidation, diffusion, epitaxial growth, etching, deposition and lithography and obtaining an impurity distribution or a device shape after these steps by using a calculator. Device simulation means obtaining device characteristics from the behavior of carriers within a device based on the physical shape of the device and the impurity distribution thereof. Circuit simulation means studying operation characteristics on a basic gate or a functional cell using a circuit simulator while considering the manufacturing variations, temperature and aged deterioration of a device. One reason such simulation is utilized and required more frequently than before is that it takes greater time from the determination of a specification to design to manufacture as larger-scale integrated circuits are increasingly manufactured. The simulation method as described above has met the above-mentioned demand and been developed to obtain more precise analysis results.

It is imperative to predict device performance (characteristics) easily and precisely in the manufacture of a semiconductor integrated circuit. To this end, it is necessary to adjust, that is, extract a parameter (to be referred to as a model parameter hereinafter) based on the physical model set by the simulator appropriately. Such adjustment or extraction is made by a model parameter extracting apparatus. Using the apparatus, a model parameter is adjusted to conform to the characteristics of an experimental device in the required manufacturing conditions and to optimize the manufacturing conditions. Therefore, the model parameter extracting apparatus plays an important role.

Meanwhile, the above-described simulation supposes a certain physical model and obtains various characteristic values by calculation based on the model. The characteristic values (to be referred to as target characteristic values hereinafter) obtained by the simulation are associated with a relevant certain physical value and a model parameter associating them is obtained. Finally, the model parameter is adjusted so that the target characteristic values and characteristic values obtained by the actual measurement (to be referred to as actual characteristic values hereinafter) fall within a certain allowable range.

For the adjustment of the model parameter, the relationship between the target characteristic values and the physical quantity is first obtained. The model parameter is determined to satisfy the relationship. In many cases, target characteristic values are discrete with respect to a physical quantity and it is often impossible to obtain the relationship between the target characteristic values and the actual characteristic values. To obtain the relationship, therefore, RSM (Response Surface Methodology) of the design of experiment disclosed by, for example, a reference titled "IEEE TRANSACTIONS ON SEMICONDUCTOR MANUFACTURING, VOL. 7, NO. 1, FEBRUARY 1994" has been conventionally used. By using the RSM, an RSF (Response Surface Function) is obtained and target characteristic values continuously corresponding to the change in a physical quantity by using the RSF. As a result, the comparison between the target characteristic value and the actual characteristic value is made possible, thereby adjusting the model parameter such that the target characteristic value and the actual characteristic value fall within a certain allowable range.

However, the above-described conventional parameter adjustment (or extraction) has disadvantages (1) to (3) as follows:

(1) It is rare that an optimum parameter to conform to the target characteristic value falls within a model parameter first set. This makes it difficult to set the adjustment range of the model parameter and requires manual work to update the parameter, that is, to reset the adjustment range of the model parameter.

(2) If the number of model parameters increases, the number of simulation for making an RSF increases. As a result, calculating time is lengthened.

(3) There are cases where such a model parameter capable of making target characteristic values and actual characteristic values fall within an allowable range cannot be obtained only by making a physical model used in the process, device or circuit simulation.

An object of the present invention is to provide a model parameter extracting method and a model parameter extracting apparatus capable of realizing the full automation of the apparatus by automatically re-setting the adjustment range of a model parameter, capable of reducing the number of simulation operations, that is, shortening calculating time by narrowing down the number of parameters and capable of keeping target characteristic values and actual characteristic values within an allowable range.

SUMMARY OF THE INVENTION

In accordance with an aspect of the present invention, there is provided with a model parameter extracting apparatus which comprises: a range designation unit for designating an adjustment range of a model parameter inputted from outside; a simulator for calculating a target characteristic value; a calibrator for conducting calibration of the model parameter with respect to the calculated target characteristic value by adjusting the model parameter within the designated adjustment range; a determination unit for determining convergence between the target characteristic value and an actual characteristic value; and a range update unit for resetting an adjustment range of the model parameter in accordance with a convergence determination result of the determination unit, and wherein the range update unit comprises: a detection unit for detecting, as a quasi-optimum value, a model parameter capable of providing a slightest difference between the target characteristic value and the actual characteristic value; and a new range designation unit for designating, as a new adjustment range, a numerical range having a half length of a length of the adjustment range while the quasi-optimum value set at a center value.

By the calibration of a model parameter, it is meant obtaining a model parameter satisfying the relationship between the target characteristic value and the physical quantity as described above. By the determination of convergence between the target characteristic value and the actual characteristic value, it is meant determining whether or not the difference between the target characteristic value and the actual characteristic value falls within an allowable range. The quasi-optimum value is a model parameter value which, while the model parameter is adjusted within a certain adjustment range, does not provide the difference between the target characteristic value and the actual characteristic value falling within the allowable range but which provides the best convergence result within the adjustment range.

Since the model parameter extracting apparatus according to the present invention comprises the above-described range update unit, it is possible to narrow down the model parameter adjustment range automatically. As a result, there is no need to re-set a model parameter manually as in the case of the conventional apparatus. Thus, the automation of the model parameter extracting apparatus can be realized.

In the model parameter extracting apparatus according to the present invention, it is preferable that the range update unit comprises a range shift unit for, if the quasi-optimum value is a value at one end of the adjustment range, shifting the adjustment range such that the quasi-optimum value is at an end other than the end of the adjustment range while maintaining the length of the adjustment range.

Thanks to the range update unit having such a structure, it is possible to appropriately set the adjustment range including an optimum model parameter and to narrow down the adjustment range.

It is preferable that the model parameter extracting apparatus according to the present invention comprises a combination designation unit for outputting combinations of parameters within the adjustment range if there are a plurality of parameters.

Thus, the adjustment range designated by the range designation unit is inputted into the combination designation unit. The combination designation unit adjusts each of the model parameters within the adjustment range and then outputs the model parameter to the calibrator. Therefore, even if it is necessary to adjust a plurality of model parameters, all of the combinations of the model parameters within the adjustment ranges are sequentially outputted to the calibrator by the combination designation unit.

In the model parameter extracting apparatus according to the present invention, it is preferable that the calibrator comprises a sensitivity analysis unit for detecting a model parameter having low sensitivity to the target characteristic value.

The above-described calibrator obtains the relationship between the model parameter and the target characteristic value by using, for example, RSM. The calibrator in this embodiment comprises a sensitivity analysis unit for detecting the degree of a change in the target characteristic value with respect to a change in each model parameter. The sensitivity analysis unit has a function of determining a model parameter having a detected degree of the change smaller than a preset value as a low sensitivity model parameter. The low sensitivity parameter thus detected is a parameter which does not relatively greatly change the target characteristic value. In other words, the target characteristic value does not relatively greatly depend on such a low sensitivity model parameter. Therefore, by adjusting only model parameters other than the low sensitivity model parameter, calculating time can be shortened.

It is preferable that the model parameter extracting apparatus according to the present invention comprises a parameter setting unit for setting a user parameter.

The user parameter is a parameter which can be arbitrarily set by a user. Since it is required to widely and precisely predict characteristics of a device experimentally manufactured in the intended manufacturing conditions, the user parameter is used to give dependency at a manufacturing condition level to the parameter set only as a constant in the existing process model, device model and circuit model. Therefore, even if the target characteristic value and the actual characteristic value cannot converge within an allowable range by using only the existing physical models, these values can converge within the allowable range by setting the user parameter in the parameter setting unit and by making an adjustment using the user parameter.

It is preferable that the model parameter extracting apparatus according to the present invention comprises a memory unit for storing adjustment procedures of the model parameter, that the range designation unit designates the adjustment range while referring to the memory unit, and that the combination designation unit adjusts the model parameter while referring to the memory unit.

Thus, it is possible to utilize procedures used in the model parameter extraction for the previous same or similar manufacturing process by storing model parameter extracting procedures (or adjustment procedures) as database in the memory unit and by using the database thereafter.

In accordance with a second aspect of the present invention, there is provided a model parameter extracting method, which method comprises the steps of: designating an adjustment range of a parameter inputted from outside; calculating a target characteristic value; conducting calibration of the model parameter with respect to the calculated target characteristic value by adjusting the model parameter within the designated adjustment range; determining convergence between the target characteristic value and an actual characteristic value; re-setting an adjustment range of the model parameter in accordance with a convergence determination result of the determination unit; detecting, as a quasi-optimum value, a model parameter capable of providing a slightest difference between the target characteristic value and the actual characteristic value; and designating, as a new adjustment range, a numerical range having a half length of a length of the adjustment range while the quasi-optimum value set at a center.

Thus, the model parameter extracting method according to the present invention comprises the above-described range update step. Due to this, it is possible to narrow down the model parameter adjustment range automatically. As a result, there is no need to re-set a model parameter manually as in the case of the conventional method. Therefore, the automation of the model parameter extracting procedures can be realized.

In the model parameter extracting method according to the present invention, it is preferable that the range update step includes a range shift step of, if the quasi-optimum value is a value at one end of the adjustment range, shifting the adjustment range such that the quasi-optimum value is at an end other than the one end of the adjustment range while maintaining the length of the adjustment range.

By conducting the range update step, it is possible to appropriately set an adjustment range including an optimum model parameter and to narrow down the adjustment range.

It is preferable that the model parameter extracting method according to the present invention comprises a combination designation step of, if there are a plurality of the model parameters, combining the model parameters within the adjustment range and outputting the combined model parameters.

Thus, in the combination designation step, while referring to the adjustment range designated in the range designation step, each model parameter is appropriately adjusted within the adjustment range. Therefore, if it is necessary to adjust a plurality of model parameters, all of the combinations of the respective model parameters within the adjustment ranges can be sequentially outputted by the combination designation step.

It is preferable that the model parameter extracting method according to the present invention comprises a sensitivity analysis step of detecting a model parameter having low sensitivity to the target characteristic value.

In the above-described calibration step, the relationship between the model parameter and the target characteristic value is obtained by using, for example, RSM. The calibration step also includes a sensitivity analysis step of detecting the degree of a change in the target characteristic value with respect to a change in each model parameter.

In the sensitivity analysis step, the relationship between the model parameter and the target characteristic value is obtained by using, for example, RSM. In addition, the degree of a change in the target characteristic value with respect to a change in each model parameter is detected. In the sensitivity analysis step, it is determined a model parameter having a detected degree of change smaller than a certain pre-set value as a low sensitivity model parameter. Only model parameters other than the low sensitivity parameter are adjusted. As a result, calculating time can be shortened.

It is preferable that the model parameter extracting method according to the present invention utilizes a user parameter.

Thus, even if there is a case where the target characteristic value and the actual characteristic value cannot converge within the allowable range by using only the existing physical model, these values can converge within the allowable range by using the user parameter.

It is preferable that the model parameter extracting method according to the present invention comprises the steps of: storing adjustment procedures of the model parameter in a memory unit; and designating the adjustment range and adjusting the model parameter by referring to the memory unit.

Thus, model parameter extracting procedures are stored as database in the memory unit. It is therefore possible to utilize those procedures used previously in the model parameter extraction for the same or similar manufacturing process by using the database. As a result, the number of simulation operations and calculating time can be reduced.

BRIEF DESCRIPTION OF THE DRAWINGS

The foregoings and other objects, features and advantages of the present invention will be better understood from the following description taken in connection with the accompanying drawings, in which.

DESCRIPTION OF THE PREFERRED EMBODIMENTS

Embodiments of the present invention will be described with reference to the drawings. It is noted that the drawings are only schematic showing the elements, configuration and procedures to the extent that the present invention can be understood. Numerical conditions and the like to be described hereinafter are only examples. Therefore, the present invention should not be limited to the embodiments of the present invention.

First Embodiment

Figure 1:
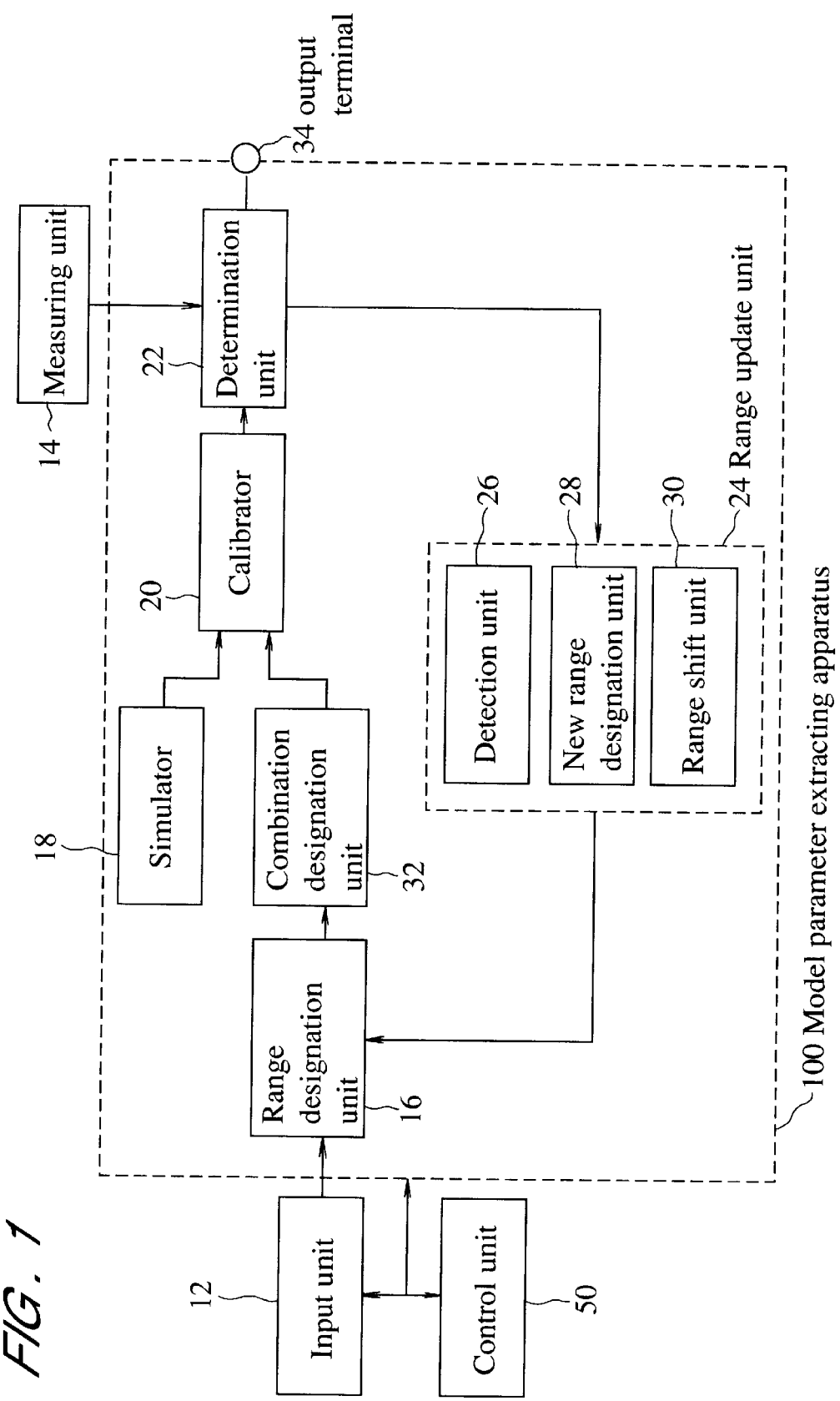
FIG. 1 shows the structure of the model parameter extracting apparatus in a first embodiment according to the present invention.

FIG. 1 is a block diagram showing the structure of a model parameter extracting apparatus in a first embodiment according to the present invention. The model parameter extracting apparatus 100 shown therein mainly comprises, as elements, a range designation unit 16, a simulator 18, a calibrator 20, a determination unit 22 and a range update unit 24. These elements will be first described in this order. It is noted that the apparatus has a structure wherein various information (data) resulting from required elements is stored in an appropriate memory region and wherein the required elements can access and read the stored information (data), if required.

The range designation unit 16 is a device for designating the adjustment ranges of a model parameter. The model parameter is inputted from the outside of the apparatus into the range designation unit 16 by an input unit 12 such as a keyboard and a mouse. In the range designation unit 16, the initial adjustment range of the inputted model parameter is designated while associating the range with the corresponding parameter. The association and the designation of the initial adjustment range are conducted by, for example, the input unit 12. The range designation unit 16 consists of, for example, a normal memory unit.

The initial adjustment range can be arbitrarily set from outside by a user or by reading an adjustment range stored as a default value in advance in the appropriate memory region provided in the model parameter extracting apparatus 100. Alternatively, it is possible for a user to change the default value appropriately after reading the default value stored in advance and to set an adjustment range.

In the range designation unit 16, there are cases where the parameter adjustment range is changed not only at the time of the designation of an initial adjustment range but also at later processes.

In case of a target electric characteristic value associated with a model parameter on the basis of power order, an adjustment range is changed by the x-th power of 10 (where x is an arbitrary constant). Threshold voltage serving as a target characteristic value with respect to the model parameter of a diffusion constant is one example. In case of a target electrically characteristic value linearly associated with a model parameter, an adjustment range is changed linearly. Threshold voltage serving as an electrically characteristic value with respect to a work function serving as a model parameter is one example.

The range designation unit 16 outputs the model parameter within the designated adjustment range to the calibrator 20. If a plurality of model parameters are inputted into the range designation unit 16, a combination designation unit 32 is provided on the output side of the range designation unit 16. The combination designation unit 32 combines model parameters within the adjustment ranges and outputs the combinations of the parameters if there are a plurality of model parameters. In the combination designation unit 32, the model parameters within the corresponding adjustment ranges are arbitrarily combined and the parameter combinations are sequentially outputted to the calibrator 20. The combination method and output order of the parameter combinations are obtained by means of the normal design of experiment.

Figures 2, 3:
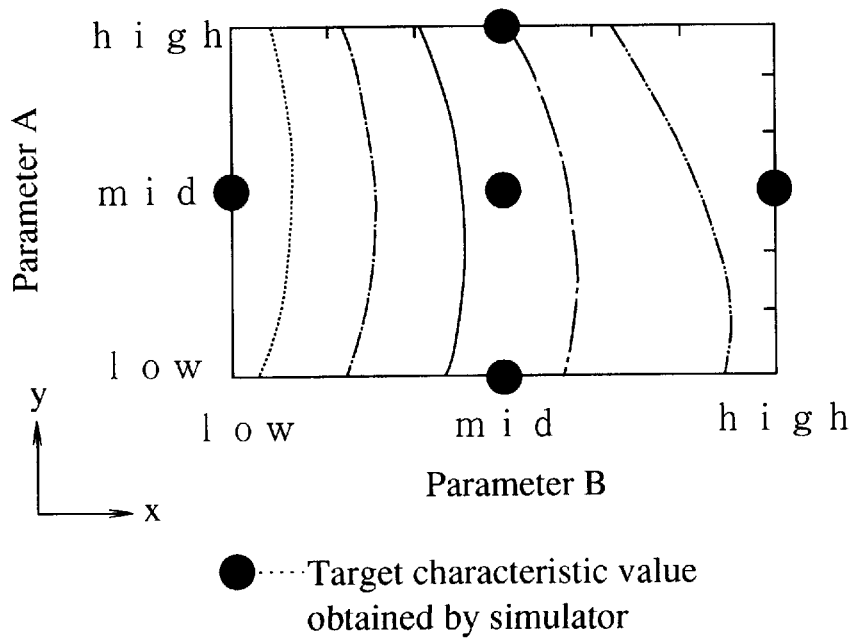
FIG. 2 illustrates an example of a design table.
FIG. 3 illustrates an example of RSFs.

The combinations of the model parameters are also determined by manufacturing conditions. A table showing the combinations of model parameters arranged in accordance with manufacturing conditions is referred to as a design table. FIG. 2 is an example of the design table. In FIG. 2, model parameters A, B and C with respect to conditions 1–4 are shown. In FIG. 2, parameters are indicated as binary, that is, logic level "low and "high". The parameters are turned to "low" level or "high" level according to the conditions, respectively. For example, in the condition 1, parameter A is at "low" level, parameter B at "low" level and parameter C at "low" level. In the condition 2, on the other hand, parameter A is at "high" level, parameter B is at "low" level and parameter C is at "low" level. As is evident from this, combinations are changed according to the conditions.

The simulator 18, that is, simulation system is for calculating a target characteristic value. The simulator 18 has a required physical equation and a parameter necessary for the equation stored in advance in the memory region thereof. Process simulation stores, for example, a diffusion equation and its diffusion constant. Device simulation stores a continuous system, the mobility within the system and the like. The simulator 18 calculates a target characteristic value based on, for example, a given physical model by a well-known method. Suppose there is a process flow serving as a physical model. In this case, process simulation is conducted to the process flow and, for example, impurity distribution and a shape are first obtained. The obtained impurity distribution and shape are then subjected to device simulation, thereby obtaining a target characteristic value such as an electrically characteristic value.

In addition, the calibrator 20 adjusts a model parameter within the adjustment range designated by the range designation unit 16 and conducts the calibration of the model parameter with respect to the target characteristic value obtained by the simulator 18. The calibrator 20 in this embodiment first makes an analysis based on the RSM and creates an RSF for associating the model parameter with the target characteristic value. Using the RSF, the target characteristic value which is discrete with respect to the model parameter is corrected, thereby obtaining a continuous target characteristic value.

FIG. 3 is a graph showing an example of the RSF. FIG. 3 shows an RSF obtained with respect to a target characteristic value associated with parameters A and B. The axis of abscissa indicates the parameter B and the axis of ordinates indicates the parameter A. Each of the axes indicates is scaled as 'low', 'mid' (middle level) and 'high'. A curve in this graph indicates a certain target characteristic value. A curve in the graph corresponds to one target characteristic value. In other words, one curve is equal in value and the curve is an equal characteristic value curve. Curves are arranged in accordance with the degree of target characteristic values. If using the graph, therefore, it is possible to obtain a target characteristic value with respect to an arbitrary model parameter within the adjustment ranges. This means that a target characteristic value can be corrected with reference to the graph.

In FIG. 3, target characteristic values obtained by the simulator 18 are indicated by black dots. Five target characteristic values are shown in the graph. As can be seen from the graph FIG. 3, the target characteristic values obtained by the simulator 18 are discrete with respect to model parameters. They are corrected by using the RSF accordingly. As a result, continuous target characteristic values with respect to the model parameters can be obtained.

Now, the determination unit 22 determines convergence between the target characteristic value and the actual characteristic value. An actual characteristic value is inputted into the determination unit 22 from a measuring device 14 provided outside the apparatus. The target characteristic value obtained by the calibrator 20 is inputted into the determination unit 22. The determination unit 22 detects the difference between the target characteristic value and the actual characteristic value where physical quantities serving as the parameters of these values, respectively become equal. The determination unit 22 determines whether or not the detected difference falls within an allowable range set in accordance with a manufacturing condition. The convergence determination is conducted in accordance with the following formula (1):

$$|\text{Target Characteristic Value} - \text{Actual Characteristic Value}| < \text{Allowable Range} \tag{1}$$

If the formula (1) is satisfied, model parameter extracting operation is completed. As a result, a model parameter is extracted. If the formula (1) is not satisfied, the adjustment range of the model parameter is changed by the range update unit 24 and calibration is conducted again.

The range update unit 24 re-designates the adjustment ranges of the model parameter in accordance with the convergence determination result of the determination unit 22. As mentioned above, if formula (1) is not satisfied, a signal is sent to the range update unit 24 from the determination unit 22 and the range update unit 24 re-designates an adjustment range. The adjustment range designated by the range update unit 24 is replaced with the previously set adjustment range and set as an adjustment range by the range designation unit 24. If the model parameter is adjusted within the adjustment range re-designated by the range update unit 24, the above-described elements are operated and formula (1) is not still satisfied, then the re-designation of the adjustment range is further conducted by the range update unit 24. In this way, the range update unit 24 continues re-designation of an adjustment range until formula (1) is satisfied.

The operation timing of the above-described range designation unit 16, the combination designation unit 32, the simulator 18, the calibrator 20, the determination unit 22 and the range update unit 24 which are the constituents of the model parameter extracting apparatus 100, is controlled by a control unit 50 as in the case of the conventional apparatus. Such a model parameter extracting apparatus can be constituted as a computer apparatus comprising, for example, a central processing unit (CPU), a memory unit and an input/output unit. A model parameter is outputted from an output terminal 34 of such a model parameter extracting apparatus 100, that is, from the output terminal of the determination unit 22 and the model parameter is made use of as useful design information by an external computer unit or the like.

Figure 4:
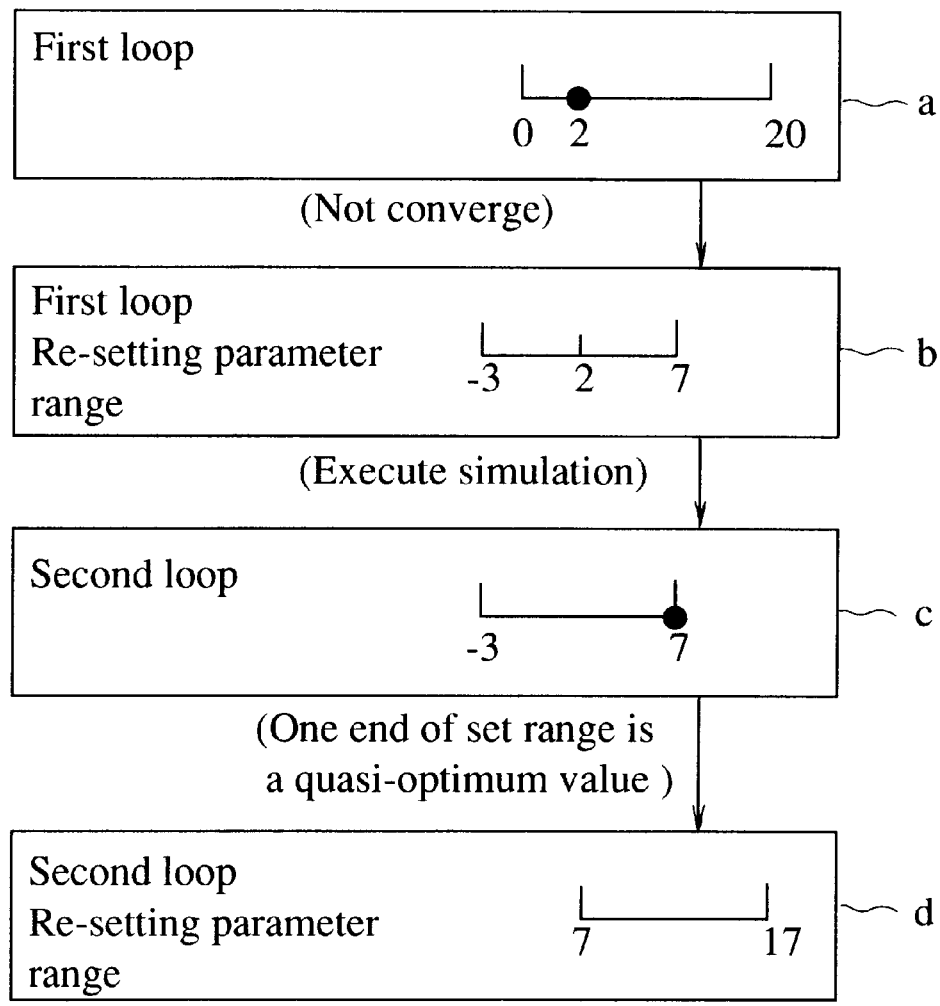
FIG. 4 is a view for describing range update operation.

The range update unit 24 will be described in more detail. In this embodiment, the range update unit 24 is characterized by its structure. That is, the range update unit 24 in this embodiment comprises a detection unit 26, a new range designation unit 28 and a range shift unit 30 (see FIG. 1). These elements will now be described with reference to FIG. 4. FIG. 4 typically shows adjustment ranges set by a certain range update process within windows a, b, c and d. Numbers shown at both ends of number lines indicate adjustment ranges. Black dots denote quasi-optimum values, respectively.

The detection unit 26 detects a model parameter capable of providing the slightest difference between a target characteristic value and an actual characteristic value, as a quasi-optimum value. The detection unit 26 detects, as a quasi-optimum value, a model parameter which does not ensure that the difference between the target characteristic value and the actual characteristic value falls within an allowable range but which provides the best convergence result within the adjustment range set at that time.

The window a of FIG. 4 shows a case where value 2 is detected as a quasi-optimum value when an adjustment range is set between 0 and 20. That is, the case shown in the window a of FIG. 4 indicates that the difference between the target characteristic value and the actual characteristic value does not converge after the first loop operation in the model parameter extracting apparatus 100.

The detection unit 26 comprises a circuit for determining whether or not the quasi-optimum value is a value at one end of the adjustment range. If the circuit determines that the detected quasi-optimum value is not a value at one end of the adjustment range, the detection unit 26 passes the quasi-optimum value and the value of both ends of the adjustment range on to the new range designation unit 28.

The new range designation unit 28 designates, as a new adjustment range, a numerical range having a half length of that of the adjustment range with the quasi-optimum value set as a center value. Namely, as shown in the window b of FIG. 4, while the quasi-optimum value 2 is a center value, the adjustment range of −3 to 7 having a half length, i.e., 10 of the length 20 of the previously set adjustment range of 0 to 20 is set as a new adjustment range by the new range designation unit 28. The new adjustment range is set as a re-designated adjustment range by the range designation unit 16. The model parameter extracting apparatus 100 starts second loop operation, which adjusts the model parameter within the new adjustment range.

Next, description will be given to a case where the difference between the target characteristic value and the actual characteristic value does not converge as a result of the second loop operation and the quasi-optimum value detected by the detection unit 26 becomes a value at one end of the adjustment range. In this case, the detection unit 26 passes the quasi-optimum value and values of both ends of the adjustment range on to the range shift unit 30.

If the quasi-optimum value is a value at the end of the adjustment range, the range shift unit 30 shifts the adjustment range such that the quasi-optimum value becomes a value at the other end of the adjustment range while keeping the length of the adjustment range. The window c of FIG. 4 shows a case where the quasi-optimum value is 7 which is a value at the high-number side end of the adjustment range of −3 to 7. In this case, the range shift unit 30 sets, as a new adjustment range, the range of 7 to 17 where the quasi-optimum value 7 is a value at the low number-side end (see the window d of FIG. 4). The new adjustment range is set as a re-designated adjustment range by the range designation unit 16. The model parameter extracting apparatus 100 starts a next loop operation which adjusts the model parameter within the new adjustment range.

The model parameter extracting apparatus 100 as described above makes it possible to extract an optimum value of the model parameter. For example, a characteristic value such as a threshold voltage Vth and substrate bias dependency ΔVth thereof, which can be measured from the actual device of a MOSFET (MOS type field effect transistor), is calculated as a target characteristic value. The target characteristic value is compared with an actual target characteristic value and a model parameter such as a segregation coefficient of channel impurities and a diffusion coefficient can be optimized.

Figure 5:
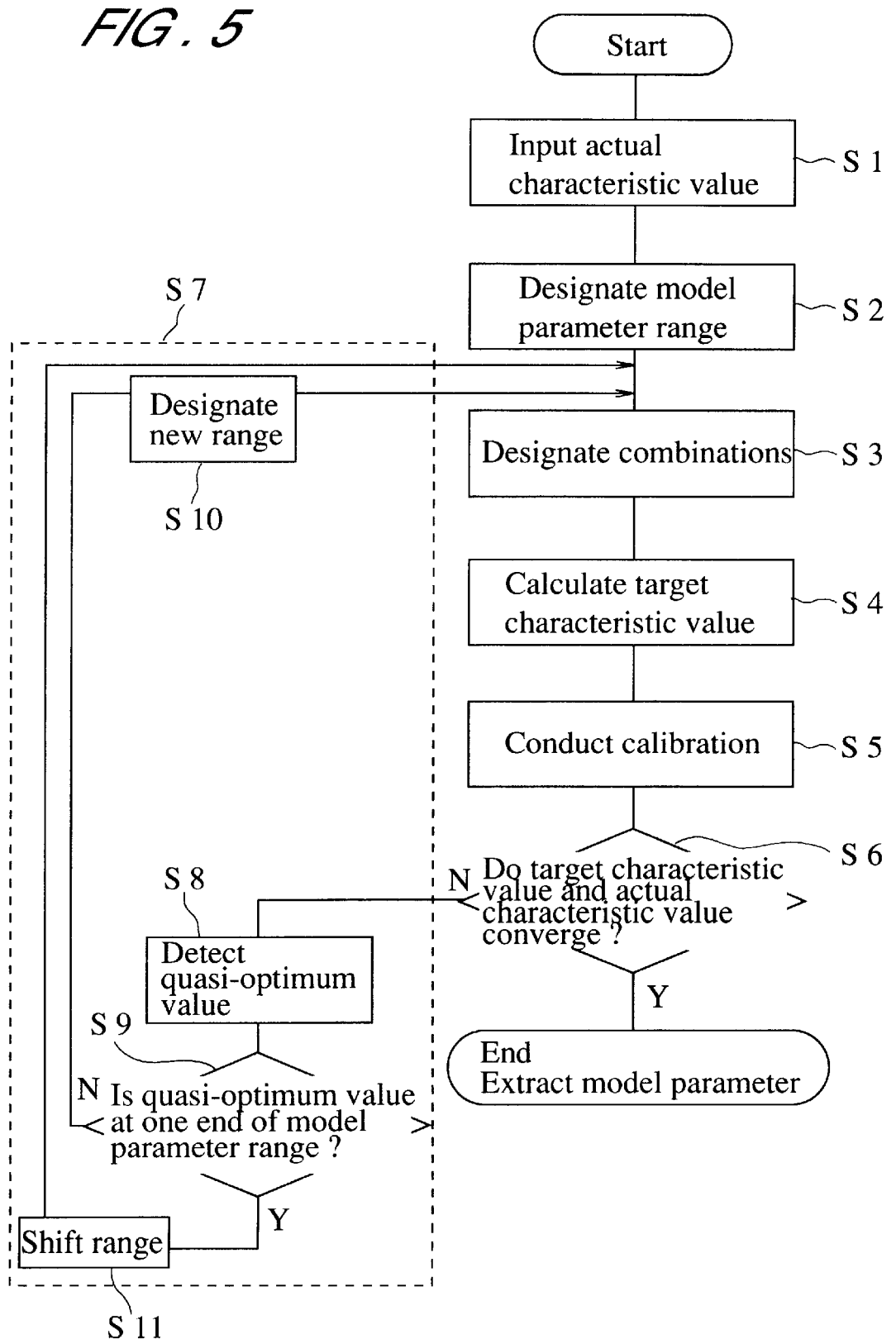
FIG. 5 is view showing a model parameter extracting flow in the first embodiment.

The overall operation flow of the model parameter extracting apparatus 100 will be described with reference to the flowchart shown in FIG. 5. FIG. 5 shows a model parameter extracting flow in the first embodiment.

An actual characteristic value is inputted from the measuring unit 14 into the determination unit 22 (in step S1 of FIG. 5). An initial adjustment range is inputted from the input unit 12 into the range designation unit 16 and the adjustment range of the model parameter is designated (in step S2 of FIG. 5). The combination designation unit 32 outputs combinations of model parameters within the adjustment ranges set by the range designation unit 16 to the calibrator 20 (in step S3 of FIG. 5). The simulator 18 calculates a target characteristic value and outputs the value to the calibrator 20 (in step S4 of FIG. 5). The calibrator 20 starts the calibration of the model parameter in accordance with the inputted model parameter and target characteristic value (in step S5 of FIG. 5). The calibration result is outputted to the determination unit 22 and the determination unit 22 determines the convergence (in step S6 of FIG. 5). If the result of the convergence determination by the determination unit 22 satisfies formula (1) (Y in step S6 of FIG. 5), the model parameter extracting operation is completed, that is, the model parameter thus adjusted is extracted from the output terminal 34. If the result of the convergence determination by the determination unit 22 does not satisfy formula (1) (N in step S6 of FIG. 5), the determination unit 22 issues a command that the range update unit 24 start operation.

The operation of the range update unit 24 will now be described (in step S7 of FIG. 5). The detection unit 26 receives a command from the convergence determination unit 22 and detects a quasi-optimum value (in step S8 of FIG. 5). The detection unit 26 examines whether or not the detected quasi-optimum value is a value at one end of the adjustment range (in step S9 of FIG. 5). If the detected quasi-optimum value is "a value at one end of" the adjustment range, the detection unit 26 outputs values at both ends of the adjustment range set by the range designation unit 16 at that time as well as the quasi-optimum value to the new range designation unit 28 (N in step S9 of FIG. 5). The new range designation unit 28 designates, as a new adjustment range, an adjustment range (numerical range) having a half length of that of the previously set adjustment range while the quasi-optimum value is set as a center value (in step S10 of FIG. 5). The new adjustment range is set by the range designation unit 16. Then, combination designation as mentioned above (in step S3 of FIG. 5), the calculation of the target characteristic value (in step S4 of FIG. 5), calibration (in step S5 of FIG. 5) and convergence determination (in step S6 of FIG. 5) are conducted for the new adjustment range. It is noted that the step of calculating the target characteristic value can be excluded if memory means for storing previously calculated target characteristic values is provided in either the calibrator 20 or the simulator 18.

The detection unit 26 outputs the quasi-optimum value and values at both ends of the adjustment range set by the range designation unit 16 at that time, to the range shift unit 30 if the detected quasi-optimum value is not a "value at one end of the adjustment range" (Y in step S9 of FIG. 5). Namely, this is a case where "a value at one end of the adjustment range" is equal to a value at one of the both ends of the adjustment range. The range shift unit 30 designates a numerical range where the "value at one end of the adjustment range" becomes a value at the other end of the adjustment range, as a new adjustment range (in step S11 of FIG. 5). That is, if "the value at one end of the adjustment range" is a value at the low number side end of the adjustment range, the numerical range is set as a new adjustment range by the range designation unit 16 such that if "the value at one end of the adjustment range" is at the low number side end of the adjustment range set at that time, it becomes a value at the high number side end of the new adjustment range and that if "the value at one end of the adjustment range" is at the high number side end of the adjustment range set at that time, it becomes at the low number side end of the new adjustment range. Combination designation as described above (in step S3 of FIG. 5), calculation of the target characteristic value (in step S4 of FIG. 5), calibration (in step S5 of FIG. 5) and convergence determination (in step S6 of FIG. 5) are then conducted for the new adjustment range.

As described so far, since the model parameter extracting apparatus 100 in this embodiment comprises the range update unit 24, the model parameter range can be re-set automatically. This can simplify model parameter adjustment operation which has been conventionally done manually, thereby making it possible to realize the automation of the entire apparatus and therefore to greatly improve working efficiency.

Second Embodiment

Figure 6:
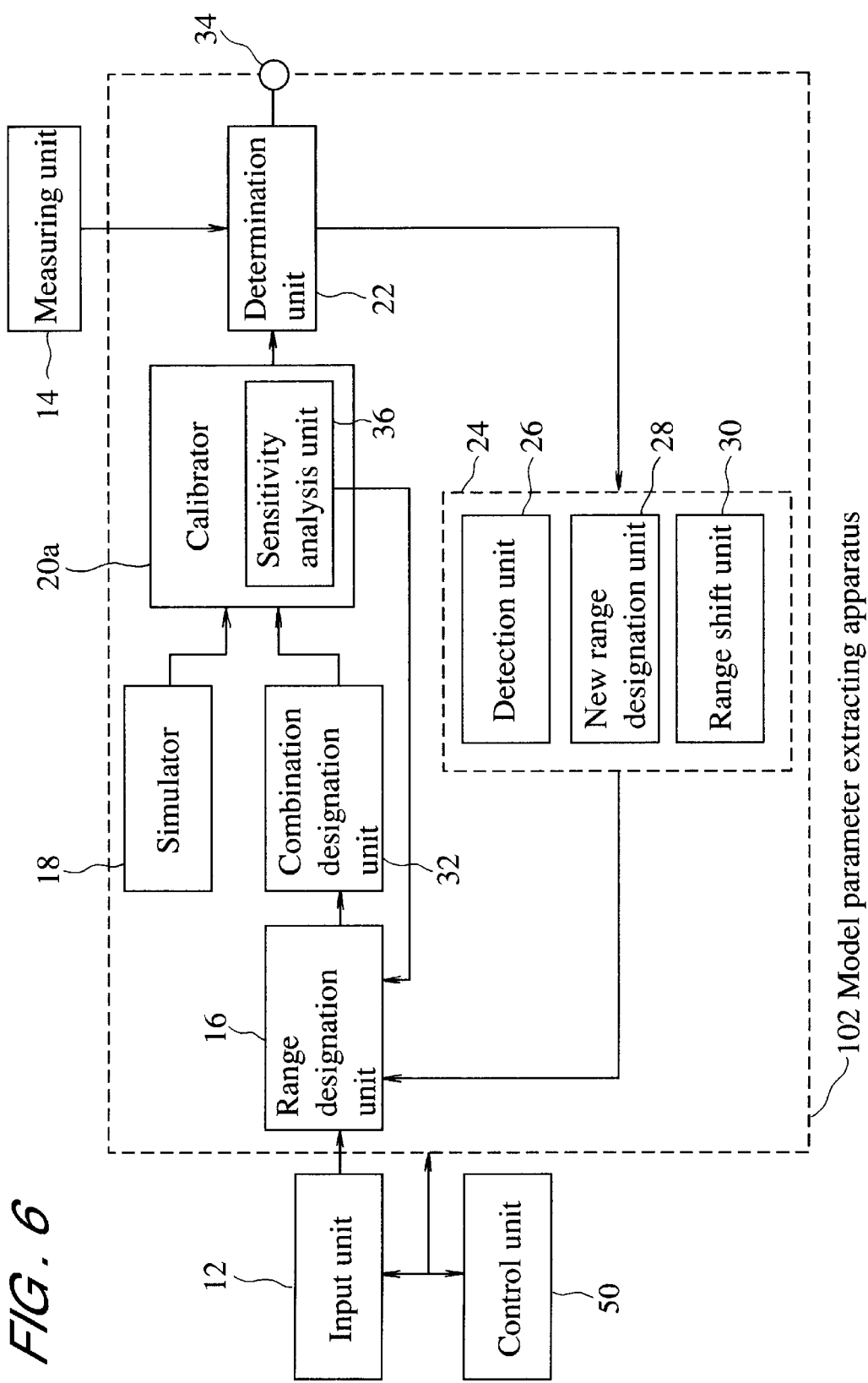
FIG. 6 shows the structure of the model parameter extracting apparatus in a second embodiment according to the present invention.

FIG. 6 is a block diagram showing the structure of a model parameter extracting apparatus in a second embodiment according to the present invention. As in the case of the first embodiment, the model parameter extracting apparatus 100 in this embodiment mainly comprises a range designation unit 16, a simulator 18, a calibrator 20a, a determination unit 22 and a range update unit 24. The structure of the apparatus 100 has a feature that the calibrator 20a has a sensitivity analysis unit 36. The sensitivity analysis unit 36 will now be mainly described and no description will be given to elements having the same structure as that of the first embodiment.

The sensitivity analysis unit 36 detects a model parameter having low sensitivity to a target characteristic value. The calibrator 20a conducts the calibration of the model parameter using the sensitivity analysis unit 36. As mentioned above, the calibrator 20a adjusts the model parameter within the adjustment range designated by the range designation unit 16 and thereby conducts the calibration of the model parameter with respect to the target characteristic value calculated by the simulator 18. The calibrator 20a first makes an analysis based on the RSM and creates an RSF associating the model parameter with the target characteristic value. Using the RSF, the target characteristic value which is discrete with respect to the model parameter is corrected to thereby provide a continuous target characteristic value. The sensitivity analysis unit 36 detects a parameter having low sensitivity to the target characteristic value using the RSF.

Description will now be given with reference to, for example, FIG. 3. As mentioned before, FIG. 3 shows RSFs obtained with respect to the target characteristic value associated with two model parameters A and B. According to curves that are RSFs shown in the graph, each curve extends in almost y direction of FIG. 3. Specifically, a change in the target characteristic value with respect to a change in the parameter A is relatively small. Changes in the respective curves in the x direction of FIG. 3 are relatively smaller than those in the y direction. In other words, a change in the target characteristic value with respect to a change in the parameter B is relatively large. Due to this, by referring to the RSFs, a parameter contributing relatively greatly to a change in the target characteristic value is detected. In addition, a parameter contributing less to a change in the target characteristic value is detected as a low sensitivity parameter. The detection of the low sensitivity parameter may be made by, for example, comparing above-mentioned two parameters A and B. If so, the parameter A is detected as a low sensitivity parameter in this case shown in FIG. 3. Alternatively, the degree of changes in the target characteristic value with respect to changes in respective parameters is detected and the detected degree is compared with a pre-set threshold value, thereby detecting a parameter in which the degree of a change is not greater than the threshold value, as a low sensitivity parameter.

Thus, a low sensitivity parameter is detected by the sensitivity analysis unit 36. As described above, a change in the target characteristic value with respect to a change in the low sensitivity parameter is relatively small. Therefore, by excluding this low sensitivity parameter at the time of calibration, calculation time during the calibration can be shortened without adversely affecting the calibration result. In this embodiment, the sensitivity analysis unit 36 detects a low sensitivity parameter from the result of the RSF(s) and issues a command that the range designation unit 16 exclude the low sensitivity parameter. The range designation unit 16 outputs adjustment ranges of parameters other than the excluded parameter to the combination designation unit 32. The combination designation unit 32 outputs combinations of parameters within the adjustment ranges designated by the range designation unit 16 to the calibrator 20a.

Figure 7:
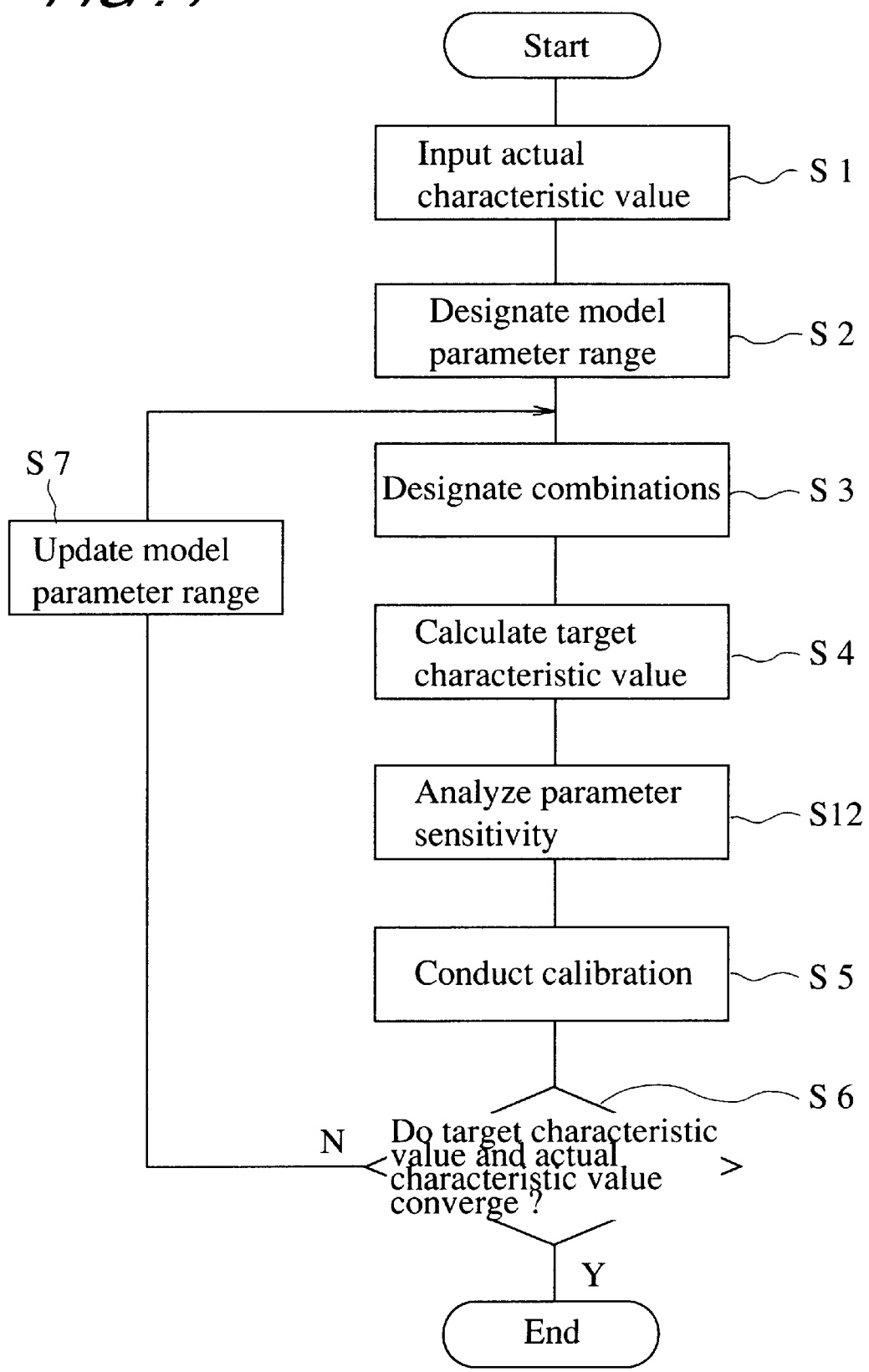
FIG. 7 is a view showing a model parameter extracting flow in the second embodiment.

The overall operation flow of the model parameter extracting apparatus 102 will be described with reference to the flowchart of FIG. 7. FIG. 7 shows a model parameter extracting flow in the second embodiment.

First, an actual characteristic value is inputted from the measuring unit 14 into the determination unit 22 (in step S1 of FIG. 7). An initial adjustment range is inputted from the input unit 12 into the range designation unit 16, thereby designating a model parameter range (in step S2 of FIG. 7). The combination designation unit 32 outputs combinations of model parameters within the adjustment ranges set by the range designation unit 16 to the calibrator 20a (in step S3 of FIG. 7). The simulator 18 calculates a target characteristic value and outputs the calculated value to the calibrator 20a (in step S4 of FIG. 7).

The calibrator 20a starts the calibration of the model parameters with respect to the target characteristic value in accordance with the inputted (combinations of) the model parameters and target characteristic value. In that case, an RSF is first created and the sensitivity analysis unit 36 analyses parameter sensitivity (in step S12 of FIG. 7). The low sensitivity parameter obtained by the sensitivity analysis unit 36 is outputted to the range designation unit 16 and the range designation unit 16 deletes the adjustment range which has been set for the low sensitivity parameter. The combination designation unit 32 designates combinations of parameters and the combinations of parameters are sent to the calibrator 20a. Thus, the calibrator 20a conducts the calibration of parameters other than the low sensitivity parameter (in step S5 of FIG. 7).

The result of the calibration is outputted to the determination unit 22 and the determination unit 22 determines the convergence (in step S6 of FIG. 7). If the result of the convergence determination by the determination unit 22 satisfies formula (1) ("Y" in steps S6 of FIG. 7), model parameter extracting operation is completed, that is, the model parameters adjusted at this time are extracted from the output terminal 34. If the result of the convergence determination by the determination unit 22 does not satisfy formula (1) ("N" in step S6 of FIG. 7), then the determination unit 22 issues a command that the range update unit 24 start operation. The model parameter range update operation (in step S7 of FIG. 7) by the range update unit 24 is the same as that described in the first embodiment. No description thereto will be therefore given herein.

As described above, since the model parameter extracting apparatus 102 in this embodiment comprises the range update unit 24, the model parameter range can be re-set automatically. This can simplify the model parameter adjustment operation which has been conventionally done manually, thereby making it possible to realize the automation of the entire apparatus and to greatly improve working efficiency.

Furthermore, since the model parameter extracting apparatus 102 in this embodiment comprises the sensitivity analysis unit 36, a low sensitivity parameter is excluded at the time of calibration. Due to this, only model parameters having sensitivity to the target characteristic value can be selected. This can decrease the number of simulation operations, reduce calculating time, that is, TAT and save development costs.

Third Embodiment

Figure 8:
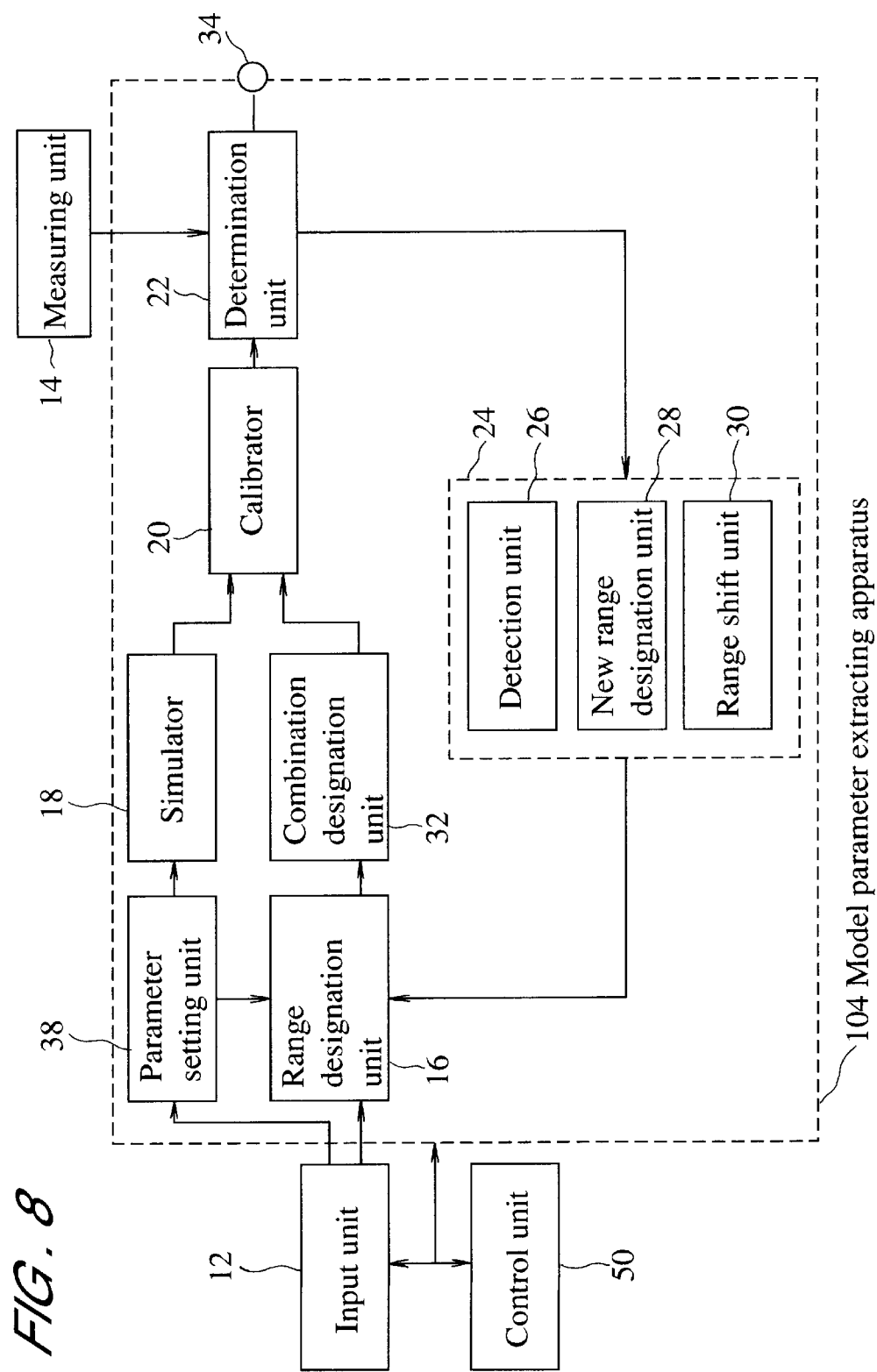
FIG. 8 is a view showing the structure of the model parameter extracting apparatus in a third embodiment according to the present invention.

FIG. 8 is a block diagram showing the structure of a model parameter extracting apparatus in a third embodiment according to the present invention. As in the case of the first embodiment, the model parameter extracting apparatus 104 in this embodiment is characterized by mainly comprising a range designation unit 16, a simulator 18, a calibrator 20, a determination unit 22 and a range update unit 24. The structure is characterized by comprising a parameter setting unit 38. The parameter setting unit 38 will be mainly described hereinafter and no description will be therefore given to the same elements as those in the case of first embodiment.

The parameter setting unit 38 sets a user parameter. Therefore, it may be constructed of a usual memory unit. The user parameter is a parameter arbitrarily set by a user of the present apparatus. The use of such a user parameter is desired when calibration cannot converge properly only using the parameters set in the simulator 18. In other words, the parameters set in the simulator 18 are based upon an existing physical model. If calibration cannot be conducted only with the physical model, the user sets an appropriate parameter and makes the calibration result converge. Supposing that a threshold voltage Vth and its substrate bias dependency $\Delta$Vth are target characteristic values, impurity dose dependency of a gate work function and the like are set as user parameters.

In the parameter setting unit 38, a user parameter is inputted from the input unit 12. When the range designation unit 16 designates an adjustment range, it refers to the parameter setting unit 38. If a user parameter has been set, the range designation unit 16 designates the adjustment range of the user parameter. The simulator 18 refers to the parameter setting unit 38 and conducts simulation including the user parameter. With such a structure, the model parameter extracting apparatus 104 can conduct calibration while the user parameter is being introduced.

Figure 9:
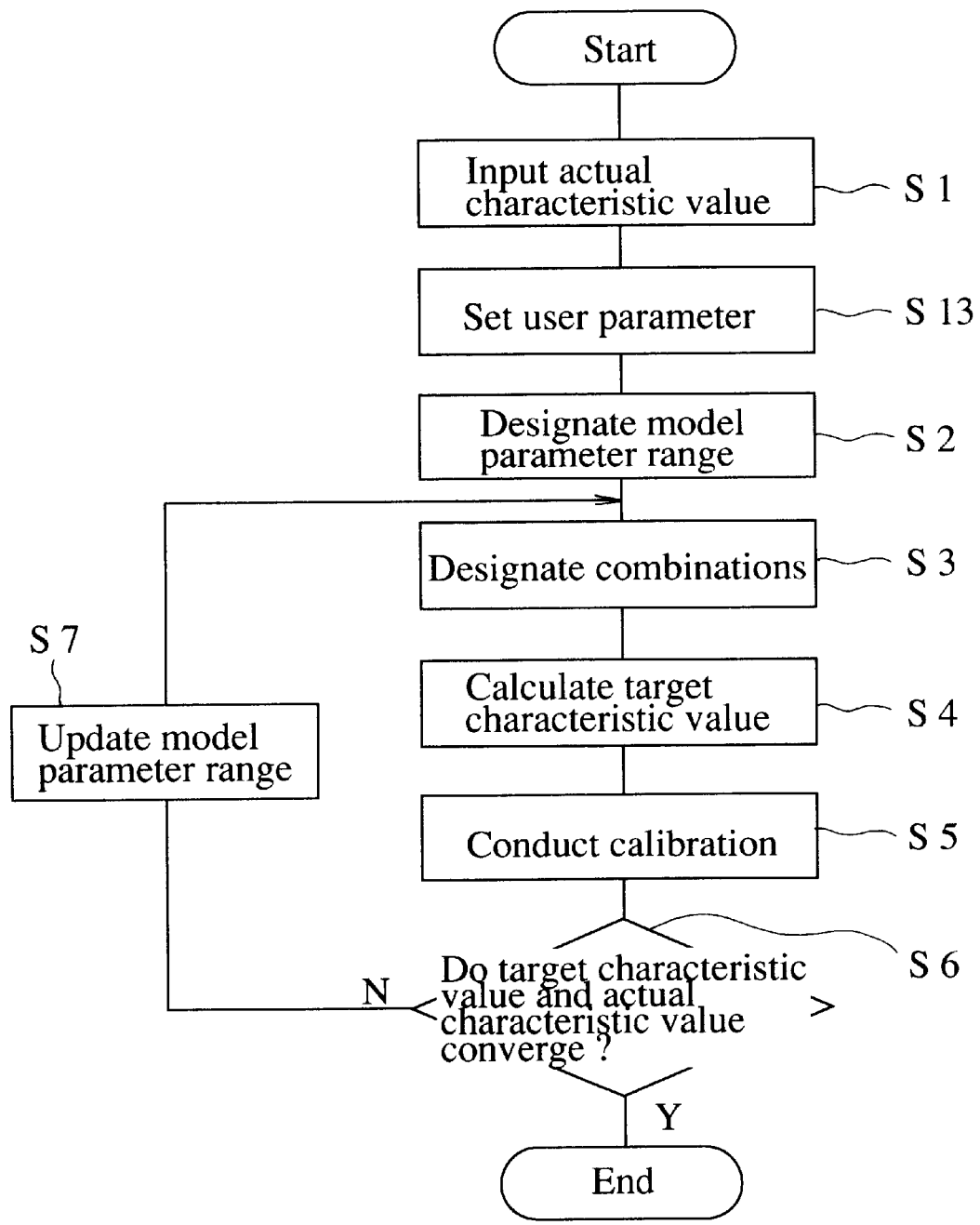
FIG. 9 is a view showing a model parameter extracting flow in the third embodiment.

The overall operation flow of the model parameter extracting apparatus 104 will now be described with reference to the flowchart of FIG. 9. FIG. 9 shows a model parameter extracting flow in the third embodiment.

An actual characteristic value is inputted from the measuring unit 14 into the determination unit 22 (in step S1 of FIG. 9). A user parameter is inputted from the input unit 12 into the parameter setting unit 38 and the user parameter is thereby set (in step S13 of FIG. 9). An initial adjustment range is inputted from the input unit 12 into the range designation unit 16 and the range of the model parameter and that of the user parameter are designated (in step S2 of FIG. 9). The combination designation unit 32 outputs combination of the model parameters and the user parameters within the adjustment ranges set by the range designation unit 16 to the calibrator 20 (in step S3 of FIG. 9). The simulator 18 calculates a target characteristic value in consideration of the user parameter and outputs the calculation result to the calibrator 20 (in step S4 of FIG. 9).

The calibrator 20 starts the calibration among (combinations of) the model parameters, the user parameters and the target characteristic value in accordance with the inputted values (in step S5 of FIG. 9). The result of the calibration is outputted to the determination unit 22 and the determination unit 22 determines the convergence (in step S6 of FIG. 9). If the result of the convergence determination by the determination unit 22 satisfies formula (1) ("Y" in step S6 of FIG. 9), then model parameter extracting operation is completed, that is, model parameters adjusted at that time are extracted from the output terminal 34. If the result of the convergence determination by the determination unit 22 does not satisfy formula (1) (N in step S6 of FIG. 9), then the determination unit 22 issues a command that the range update unit 24 start operation. The model parameter update operation (in step S7 of FIG. 9) by the range update unit 24 is the same as that described in the first embodiment and the description thereto will not be therefore given herein.

As described so far, since the model parameter extracting apparatus 104 in this embodiment comprises the range update unit 24, the model parameter range can be re-set automatically. This can greatly simplify model parameter adjustment operation which has been conventionally done manually, thereby making it possible to realize the automation of the entire apparatus and therefore to greatly improve working efficiency.

Furthermore, since the model parameter extracting apparatus 104 in this embodiment comprises the parameter setting unit 38, it is possible to conduct calibration while a user parameter is being introduced. Due to this, even if existing parameters do not converge into the pre-set allowable range, a new parameter having sensitivity to the target characteristic value can be set and convergent characteristics can be therefore improved. In other words, convergent characteristics is improved by adding a user parameter to the existing process, device or circuit model. As a result, if there is a device which does not converge within the preset allowable range, a simulator wherein a user parameter is introduced can be utilized until a new process, device or circuit model is introduced into the simulator. Thus, the apparatus in this embodiment can advantageously save development costs due to the improvement of the convergence only with the setting of such a simple user parameter.

Fourth Embodiment

Figure 10:
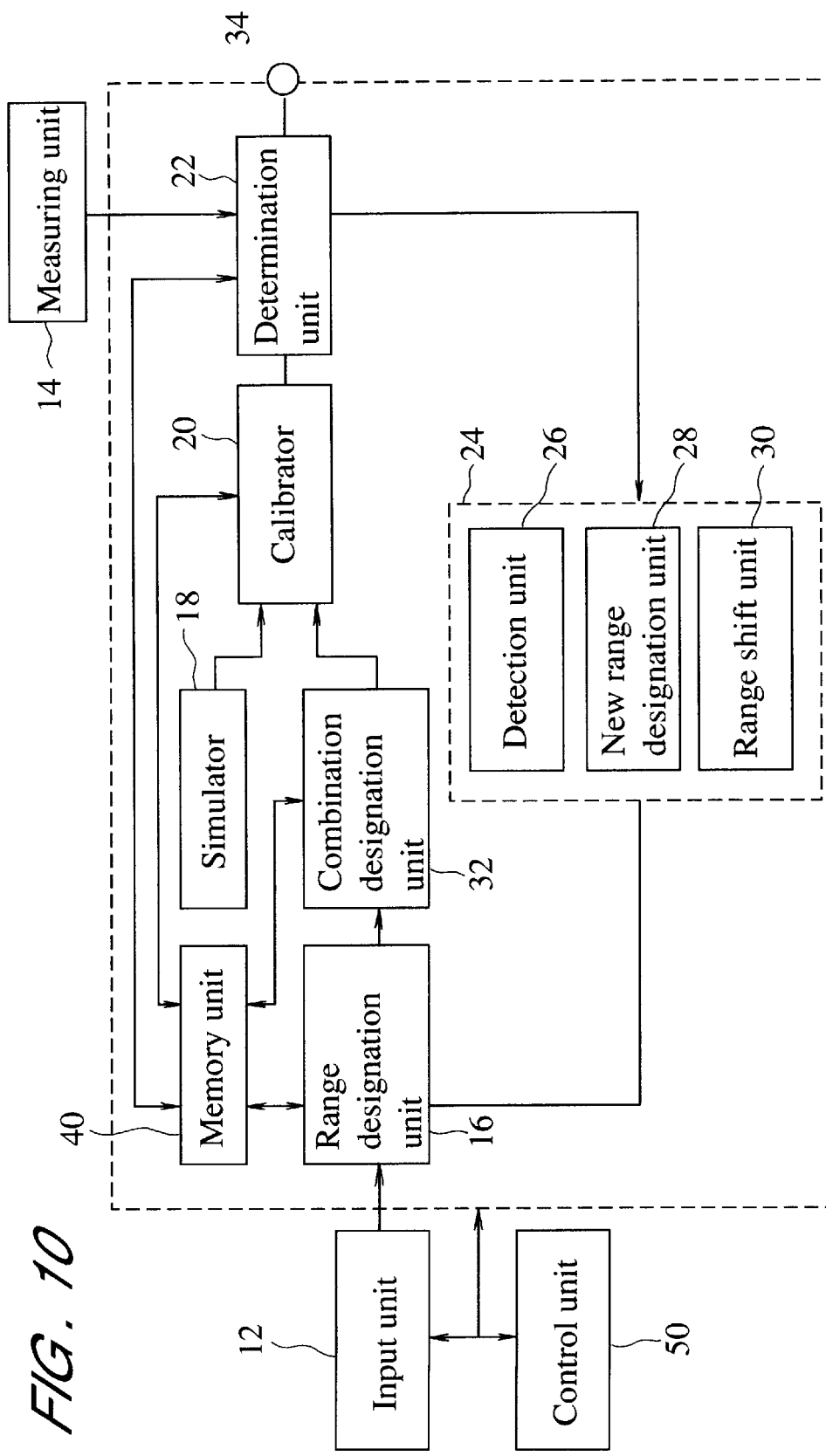
FIG. 10 shows the structure of the model parameter extracting apparatus in a fourth embodiment according to the present invention.

FIG. 10 is a block diagram showing the structure of a model parameter extracting apparatus in a fourth embodiment. As in the case of the first embodiment, the model parameter extracting apparatus 106 in this embodiment is characterized by mainly comprising a range designation unit 16, a simulator 18, a calibrator 20, a determination unit 22 and a range update unit 24. The structure is also characterized by comprising a memory unit 40. The memory unit 40 will be mainly described hereinafter and no description will be given to the same elements as those described in the first embodiment.

The memory unit 40 stores model parameter adjustment procedures. The range designation unit 16 designates an adjustment range, while referring to the memory unit 40. The combination designation unit 32 adjusts the model parameter while referring to the memory unit 40. Moreover, in this embodiment, the calibrator 20 also operates, while referring to the memory unit 40.

With such a structure, model parameter extracting procedures which were conducted previously can be stored in the memory unit 40. These procedures can be stored as (fitting) database. By using the database, the calibration of a device manufactured in the same process as the previous one can be conducted relatively easily.

Figure 11:
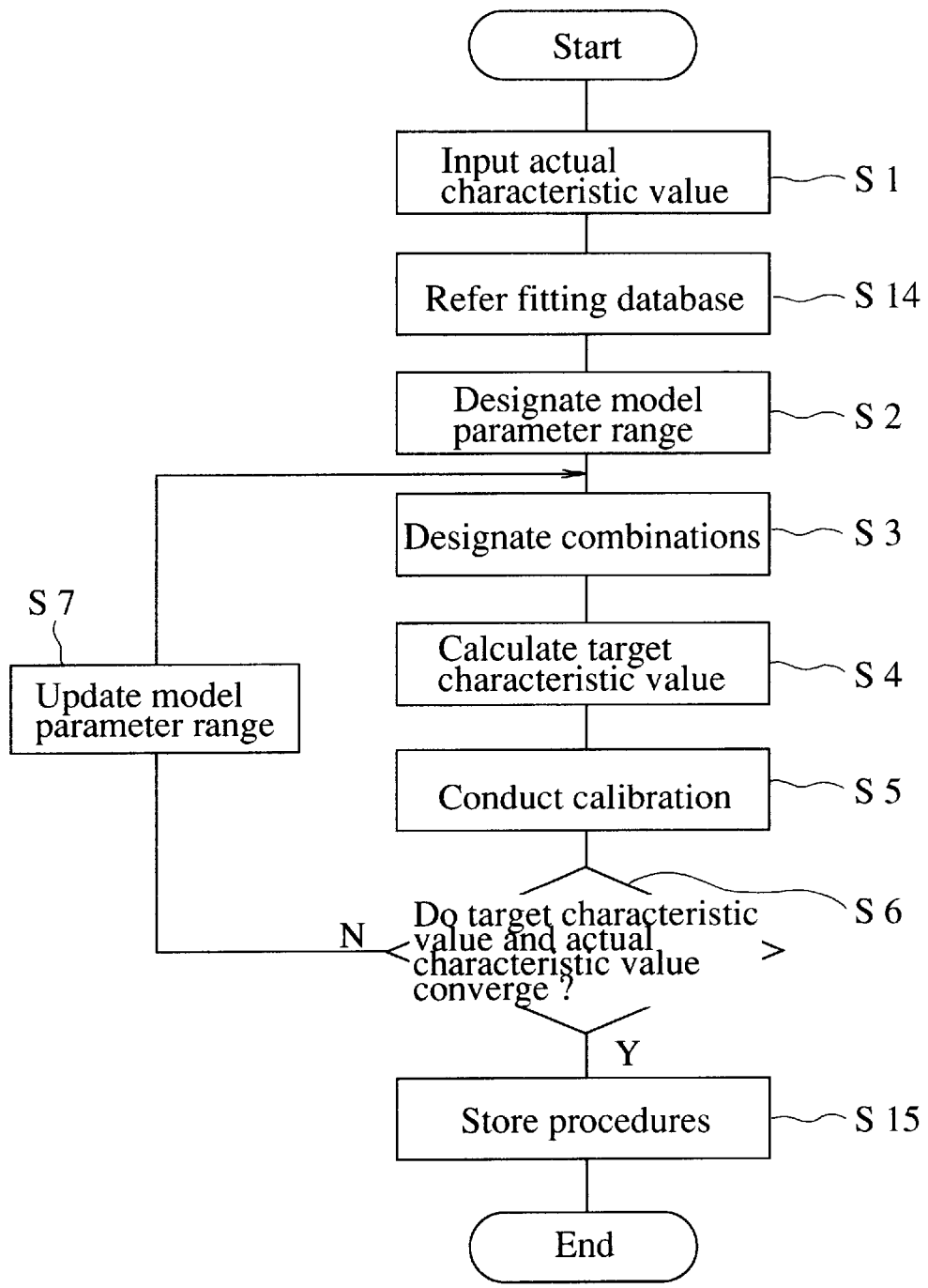
FIG. 11 is a view showing a model parameter extracting flow in the fourth embodiment.

The overall operation flow of the model parameter extracting apparatus 106 will be described with reference to the flowchart of FIG. 11. FIG. 11 shows a model parameter extracting flow in the fourth embodiment.

First, an actual characteristic value is inputted from the measuring unit 14 into the determination unit 22 (in step S1 of FIG. 11). The range designation unit 16 sets the same adjustment range as that set previously, while referring to the fitting database stored in the memory unit 40 (in steps S14 and S2 of FIG. 11). If model parameter extracting procedures to be conducted next are not the same as those conducted previously, an initial adjustment range is inputted from the input unit 12 into the range designation unit 16 as in the case of the first embodiment.

The combination designation unit 32 outputs combination signals of model parameters and user parameters within the adjustment ranges set by the range designation unit 16 to the calibrator 20 (in step S3 of FIG. 11), while referring to the memory unit 40. The simulator 18 calculates a target characteristic value and outputs the calculation result to the calibrator 20 (in step S4 of FIG. 11).

Next, the calibrator 20 starts the calibration among (combinations of) model parameters and the target characteristic value in accordance with the inputted values (in step S5 of FIG. 11). At that time, if the same calibration was conducted previously, the calibration procedures stored in the memory unit 40 are inputted into the calibrator 20 and calibration is then started. The result of the calibration is outputted to the determination unit 22 and the determination unit 22 determines the convergence (in step S6 of FIG. 11). If the result of the convergence determination by the determination unit 22 satisfies formula (1) ("Y" in step S6 of FIG. 11), model parameter extracting operation is completed, that is, model parameters adjusted at that time are extracted from the output terminal 34. Here, if the calibration result converges in this way, the determination unit 22 stores the procedures up to the model parameter extraction, as fitting database (in step S15 of FIG. 11).

If the result of the convergence determination by the determination unit 22 does not satisfy formula (1) ("N" in step S6 of FIG. 11), then the determination unit 22 issues a command that the range update unit 24 start operation. The model parameter range update operation (in step S7 of FIG. 11) is the same as that described in the first embodiment and the description thereto will not be therefore given herein.

As described so far, since the model parameter extracting apparatus 106 in this embodiment comprises the range update unit 24, the model parameter range can be re-set automatically. This can simplify model parameter adjustment operation which has been conventionally done manually, thereby making it possible to realize the automation of the entire apparatus and to therefore greatly improve working efficiency.

Furthermore, since the model parameter extracting apparatus 106 in this embodiment comprises the memory unit 40, previous model parameter extracting procedures, model parameter adjustment ranges and the like can be utilized. The memory unit 40 can store not only previous procedures but also characteristic values of a semiconductor device obtained by the actual measurement. Due to this, the number of loops relating to the parameter update can be reduced, that is, the number of simulation operations and calculating time can be reduced. Particularly, this feature is effective if the semiconductor manufacturing process is similar to that of the device which was previously subjected to calibration.

Fifth Embodiment

Figure 12:
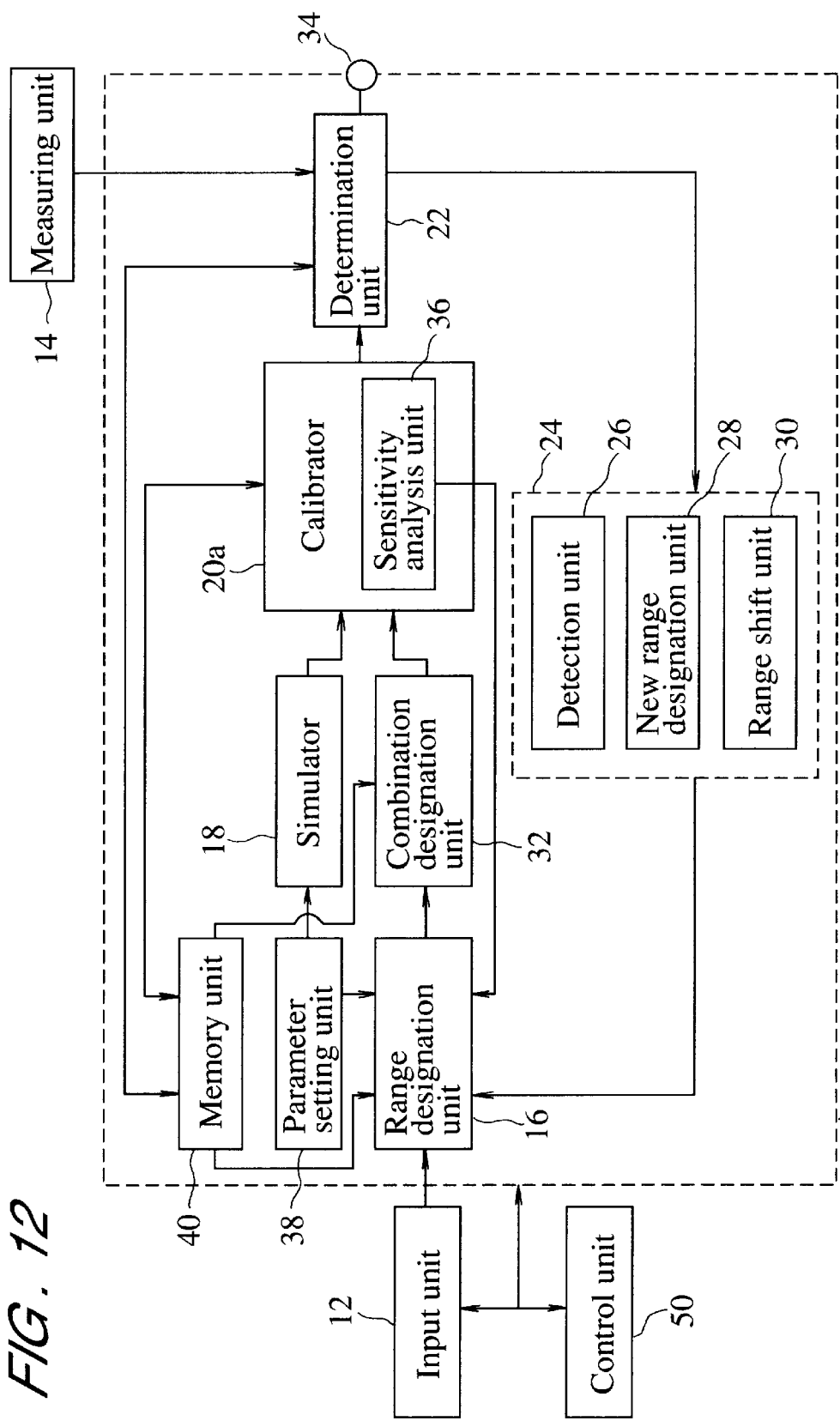
FIG. 12 shows the structure of the model parameter extracting apparatus in a fifth embodiment according to the present invention.

FIG. 12 is a block diagram showing the structure of a model parameter extracting apparatus in a fifth embodiment according to the present invention. The model parameter extracting apparatus 108 in this embodiment is a combination of the first to fourth embodiments described above. Namely, the model parameter extracting apparatus 108 in this embodiment mainly comprises a range designation unit 16, a simulator 18, a calibrator 20a, a determination unit 22 and a range update unit 24 as described in the first embodiment. The detailed structure of the range update unit 24 has been already described in the first embodiment. The apparatus 108 in this embodiment also comprises a sensitivity analysis unit 36 described in the second embodiment, a parameter setting unit 38 in the third embodiment and a memory unit 40 in the fourth embodiment. The structure of each of the elements has been already described in the preceding embodiments and no description thereto will be therefore give herein. Accordingly, the model parameter extracting apparatus 108 in this embodiment has the same advantages as described in the preceding embodiments.

In this embodiment, the result of the calibration using the model parameter extracting apparatus 108 will be described. FIG. 13(A) is a graph showing the substrate bias dependency of the threshold voltage Vth of an NMOSFET. The axis of abscissa indicates bias voltage Vb and is scaled for every two volts (V) between 0 and 14 (V) in volts (V). The axis of ordinate indicates threshold voltage Vth and is scaled for every 0.5 V between 0 and 3 V in volts (V).

FIG. 13(B) is a graph showing the difference between a target characteristic value and an actual characteristic value. The axis of abscissa indicates bias voltage Vb and is scaled for every 2 V between 0 and 14 V in volts (V) as in the case of the axis of abscissa of FIG. 13(A). The axis of ordinate indicates the difference (or residual) between the calculated value (or target characteristic value) of Vth and the actual value (or actual characteristic value) of Vth, and is scaled for every 0.05 V between −0.2. and 0.2 in volts (V).

The reference symbol # denotes a manufacturing condition, reference symbol Exp denotes an actual value and reference symbol Sim denotes a calculated value. In this embodiment, six types of manufacturing conditions, i.e. conditions 2, 4, 7, 10, 12 and 14 are used. In the respective manufacturing conditions, a calculated value (or target characteristic value) and an actual value (or actual characteristic value) are obtained and then the difference between them is obtained. In this case, while six different channel impurity doses are used as manufacturing conditions, calibration results are obtained. Actual values shown in FIG. 13(A) are obtained by changing bias voltage Vb from 0 to 8 V by one volt (V). The result of comparing the actual value with the calculated value at the bias voltage at which the actual value has been measured, is shown in FIG. 13(B). The range between −0.05 (V) and 0.05 (V) is set as an allowable range on the axis of ordinate of FIG. 13(B). In the case of FIG. 13(B), all of the obtained residuals (|Calculated Value—Actual Value|) fall within the allowable range.

Figure 13:
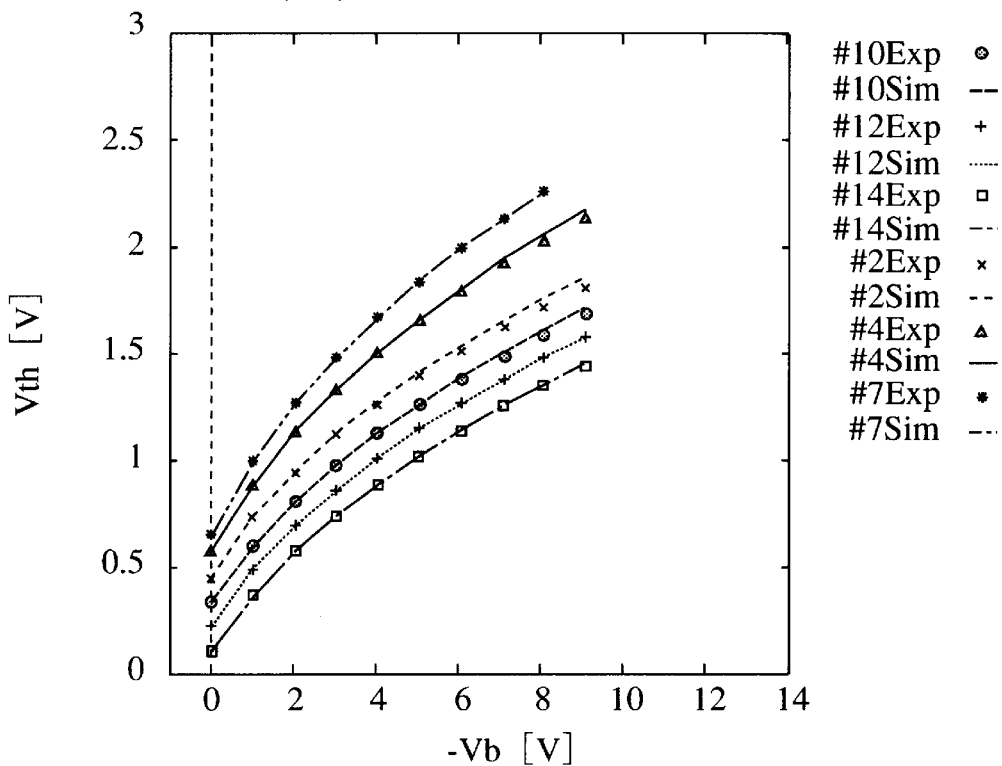
FIGS. 13A and 13B views showing calibration result when using the model parameter extracting apparatus in the fifth embodiment.
Figure 13:
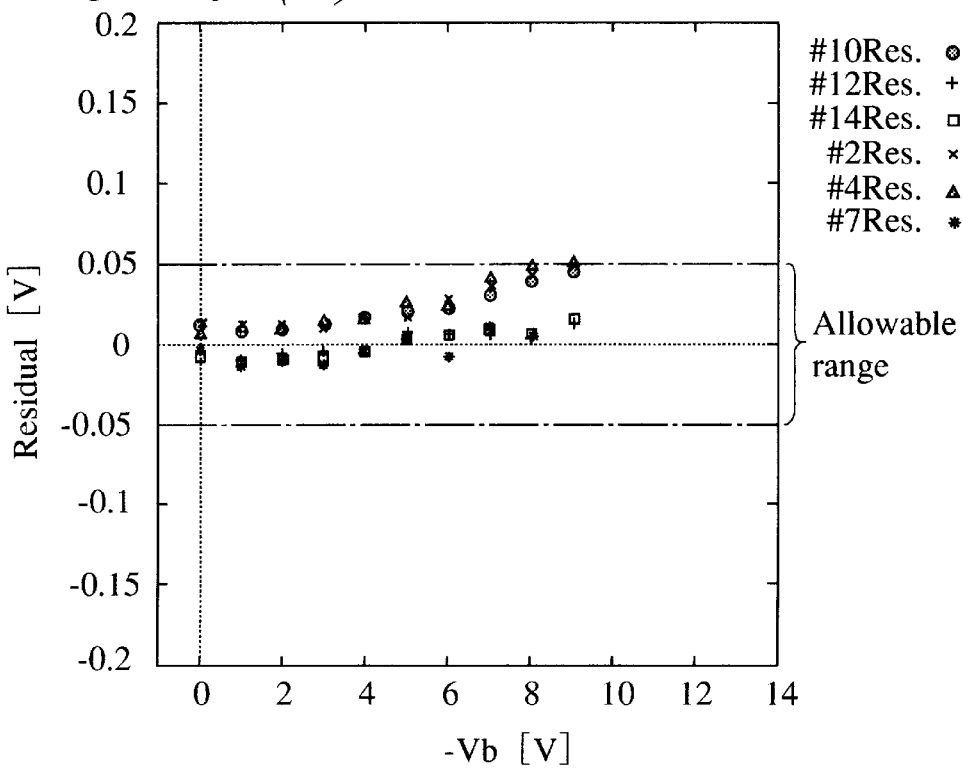
Figure 14:
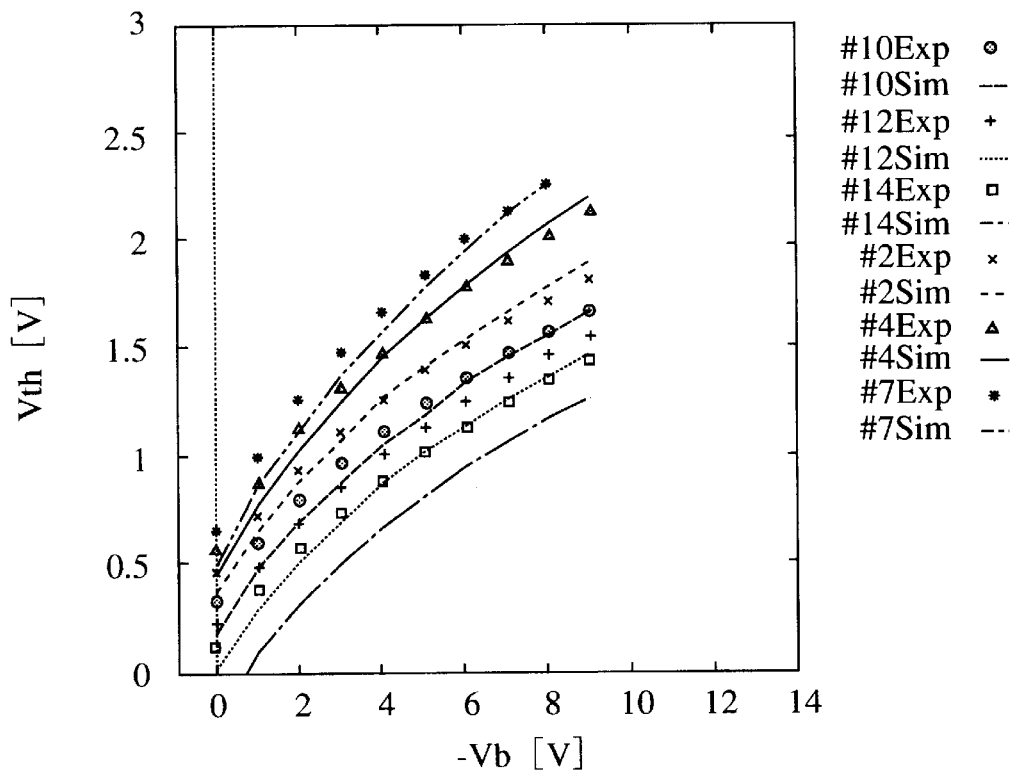
FIGS. 14A and 14B views showing the substrate bias dependency of the threshold voltage obtained without calibration.
Figure 14:
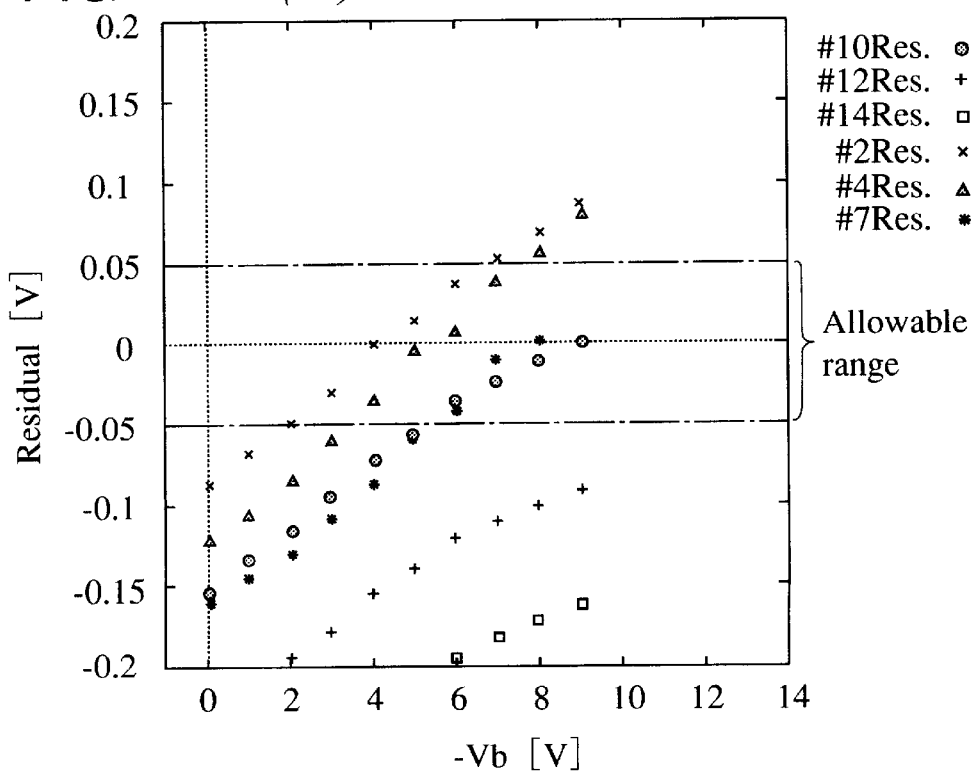

FIGS. 14(A) and (B) are graphs for the purpose of comparing the result of FIG. 13 with that of FIG. 14. FIG. 14(A) is a graph showing the substrate bias dependency of the threshold voltage Vth of an NMOSFET obtained without conducting calibration. FIG. 14(B) is a graph showing the difference between the target characteristic value and the actual characteristic value. The graphs shown in FIGS. 14(A) and 14(B) have scales, units of the axes corresponding to those shown in FIGS. 13(A) and 13(B). FIGS. 14(A) and 14(B) use the same actual values as FIGS. 13(A) and 13(B). The range between −0.05 (V) and 0.05 (V) is set as an allowable range on the axis of ordinate of FIG. 14(B). In FIG. 14(B), most of the obtained residuals (|Calculated Value—Actual Value|) are out of the allowable range.

As is obvious from the comparison of FIG. 13(B) and FIG. 14(B), the model parameter extracting apparatus 108 in this embodiment provides better convergence results. That is, all residuals shown in FIG. 13(B) are within the allowable range, whereas most of the residuals shown in FIG. 14(B) are out of the allowable range. Therefore, it is confirmed that the use of the model parameter extracting apparatus 108 in this embodiment is effective for the extraction of a model parameter.

In the embodiments described above, description has been given to a case where there are a plurality of model parameters. It is also possible to apply the present invention to a single model parameter. If only one single parameter exists, the combination designation unit 32 and the sensitivity analysis unit 36 which are the constituents of the above-described model parameter extracting apparatus, can be excluded. In case of a single model parameter, an RSF can be created by the same method as the ordinary least square method and it is shown by a graph where the X-axis indicates a model parameter and the Y-axis indicates an electrically characteristic value. In such a case, the same calibration result as that shown in FIGS. 13(A) and (B) can be obtained.

According to the present invention, the model parameter extracting apparatus comprises a range update unit having the detection unit for detecting, as a quasi-optimum value, a model parameter capable of providing the slightest difference between the target characteristic value and the actual characteristic value, and the new range designation unit for designating, as a new adjustment range, a range having a half length of that of the previous adjustment range with the quasi-optimum value set at a center value. This makes it possible to automatically narrow down the adjustment range of a model parameter. As a result, there is no need to re-set the model parameter manually as in the case of the conventional apparatus, thereby making it possible to realize the automation of the model parameter extracting apparatus.

Moreover, according to the present invention, the model parameter extracting apparatus comprises the range update unit having the range shift unit. If the quasi-optimum value is a value at one end of the adjustment range, the range shift unit shifts the adjustment range such that the quasi-optimum value is at the other end of the adjustment range, while maintaining the length of the adjustment range. With this structure of the range update unit, it is possible to appropriately set an adjustment range including an optimum model parameter and to narrow down the adjustment range.

According to the present invention, the model parameter extracting apparatus comprises the combination designation unit for outputting combinations of model parameters within the adjustment ranges if there are a plurality of model parameters. Thanks to the combination designation unit, if it is necessary to adjust a plurality of model parameters, all of the combinations of model parameters within the adjustment ranges can be outputted sequentially to the calibrator.

According to the present invention, the model parameter extracting apparatus comprises the sensitivity analysis unit for detecting a model parameter having low sensitivity to the target characteristic value. The target characteristic value does not greatly depend on the low sensitivity model parameter. Therefore, by adjusting only model parameters other than the low sensitivity model parameter, it is possible to shorten calculating time.

According to the present invention, the model parameter extracting apparatus comprises the parameter setting unit for setting a user parameter. Due to this, even if the target characteristic value and the actual characteristic value cannot converge within the allowable range only by using an existing physical model, these values can converge within the allowable range by setting the user parameter in the parameter setting unit and making an adjustment using the user parameter.

According to the present invention, the model parameter extracting apparatus can make use of those procedures used in the model parameter extraction for the previous same or similar manufacturing process by storing model parameter extracting procedures as database in the memory unit and using the database thereafter. As a result, the number of simulation operations and calculating time can be reduced.

Next, according to the present invention, the model parameter extracting method comprises a range update step. Therefore, it is possible to narrow down the model parameter adjustment range automatically. As a result, there is no need to re-set a model parameter manually as in the case of the conventional apparatus and the automation of model parameter extracting procedures can be thereby realized.

Moreover, according to the present invention, the range update step of the model parameter extracting method includes a range shift step. If the quasi-optimum value is a value at one end of the previous adjustment range, the range shift step shifts the adjustment range such that the quasi-optimum value is at the other end of the adjustment range while maintaining the length of the adjustment range. By conducting the range update step, it is possible to appropriately set an adjustment range including an optimum model parameter and to narrow down the adjustment range.

According to the present invention, the model parameter extracting method comprises a combination designation step for outputting combinations of model parameters within the adjustment ranges if there are a plurality of model parameters. Therefore, by conducting the combination designation step, it is possible to output sequentially all combinations of the model parameters within the adjustment ranges if it is necessary to adjust a plurality of model parameters.

According to the present invention, the model parameter extracting method comprises a sensitivity analysis step for detecting a model parameter having low sensitivity to the target characteristic value. By adjusting only model parameters other than the low sensitivity model parameter, calculating time can be shortened.

According to the present invention, the model parameter extracting method utilizes a user parameter. Due to this, even if the target characteristic value and the actual characteristic value cannot converge within the allowable range by using only the existing physical model, these values can converge within the allowable range by using the user parameter.

According to the present invention, the model parameter extracting method can utilize those procedures used in the model parameter extraction for the previous same or similar manufacturing process by storing model parameter extracting procedures as database in the memory unit and by using the database thereafter. As a result, the number of simulation operations and calculating time can be reduced.

What is claimed is:

1. A model parameter extracting apparatus comprising:
   a range designation unit for designating an adjustment range of a model parameter inputted from outside;
   a simulator for calculating a target characteristic value;
   a calibrator for conducting calibration of the model parameter with respect to said calculated target characteristic value by adjusting the model parameter within said designated adjustment range;
   a determination unit for determining convergence between said target characteristic value and an actual characteristic value; and
   a range update unit for re-setting an adjustment range of said model parameter in accordance with a convergence determination result of said determination unit, and wherein
   said range update unit comprises:
      a detection unit for detecting, as a quasi-optimum value, a model parameter capable of providing a slightest difference between said target characteristic value and said actual characteristic value; and
      a new range designation unit for designating, as a new adjustment range, a numerical range having a half length of a length of said adjustment range while said quasi-optimum value set at a center value.

2. A model parameter extracting apparatus according to claim 1, wherein
   said range update unit comprises a range shift unit for, if said quasi-optimum value is a value at one end of said adjustment range, shifting the adjustment range such that said quasi-optimum value is at an end other than said end of said adjustment range while maintaining the length of the adjustment range.

3. A model parameter extracting apparatus according to claim 1, further comprising a combination designation unit provided between said range designation unit and said calibrator, for outputting combinations of parameters within said adjustment range if there are a plurality of parameters.

4. A model parameter extracting apparatus according to claim 1, wherein said calibrator comprises a sensitivity analysis unit for detecting a model parameter having low sensitivity to said target characteristic value.

5. A model parameter extracting apparatus according to claim 1, further comprising a parameter setting unit for setting a user parameter by a user and used for being referred to by said simulator.

6. A model parameter extracting apparatus according to claim 3, further comprising a memory unit for storing adjustment procedures of said model parameter, and wherein
   said range designation unit designates said adjustment range while referring to said memory unit, and
   said combination designation unit adjusts said model parameter while referring to said memory unit.

7. A model parameter extracting apparatus according to claim 1, wherein
   said determination unit has difference detection means for detecting a difference between said target characteristic value and the actual characteristic value.

8. A model parameter extracting apparatus according to claim 7, wherein
   said determination unit has convergence determination means for determining whether the difference detected by said difference detection unit falls within an allowable range.

9. A model parameter extracting apparatus according to claim 1, wherein
   said detection unit has determination means for determining whether said quasi-optimum value is a value at one end of said adjustment range.

10. A model parameter extracting method comprising:
    a range designation step of designating an adjustment range of a parameter inputted from outside;
    a simulation step of calculating a target characteristic value;
    a calibration step of conducting calibration of the model parameter with respect to said calculated target characteristic value by adjusting values of the model parameter within said designated adjustment range;
    a determination step of determining convergence between said target characteristic value and an actual characteristic value;
    a range update step of re-setting an adjustment range of said model parameter in accordance with a convergence determination result of said determination step;
    a detection step of detecting, as a quasi-optimum value, a model parameter capable of providing a slightest difference between said target characteristic value and said actual characteristic value; and
    a new range designation step of designating, as a new adjustment range, a numerical range having a half length of a length of said adjustment range while said quasi-optimum value set at a center.

11. A model parameter extracting method according to claim 10, wherein
    said range update step includes a range shift step of, if said quasi-optimum value is a value at one end of said adjustment range, shifting the adjustment range such that said quasi-optimum value is at an end other than said one end of said adjustment range while maintaining the length of the adjustment range.

12. A model parameter extracting method according to claim 10, further comprising a combination designation step after said range designation step and before said calibration step of, if there are a plurality of said model parameters, combining the model parameters within said adjustment range and outputting the combined model parameters.

13. A model parameter extracting method according to claim 10, wherein said calibration step includes a sensitivity analysis step of detecting a model parameter having low sensitivity to said target characteristic value.

14. A model parameter extracting method according to claim 10, wherein said method utilizes a user parameter.

15. A model parameter extracting method according to claim 12, further comprising the steps of:

storing adjustment procedures of said model parameter in a memory unit; and designating said adjustment range and adjusting said model parameter by referring to the memory unit.

16. A model parameter extracting method according to claim 13, wherein said calibration step includes the steps of:

conducting an analysis based on RSM and making an RSF associating said model parameter and said target characteristic value; and correcting said target characteristic value, which is discrete with respect to said model parameter, by using the RSF and obtaining a continuous target characteristic value, and wherein in said sensitivity analysis step, a model parameter less contributing to a change in said obtained continuous target characteristic value among said values of the model parameter is detected as said low sensitivity model parameter.

17. A model parameter extracting method according to claim 13, wherein said calibration step includes the steps of:

conducting an analysis based on RSM and making an RSF associating said model parameter and said target characteristic value; and correcting said target characteristic value, which is discrete with respect to said model parameter, by using the RSF and obtaining a continuous target characteristic value, and in said sensitivity analysis step, a degree of a change in said obtained continuous target characteristic value is set in advance for every model parameter and a values of the model parameter, among said model parameters, having a degree of a change in said obtained continuous target characteristic value not greater than a threshold value is detected as said low sensitivity model parameter.

* * * * *